(12) United States Patent
Breitwisch et al.

(10) Patent No.: US 7,123,517 B2
(45) Date of Patent: Oct. 17, 2006

(54) REPROGRAMMABLE INTEGRATED CIRCUIT (IC) WITH OVERWRITABLE NONVOLATILE STORAGE

(75) Inventors: Matthew Breitwisch, Essex Junction, VT (US); Chung H. Lam, Peekskill, NY (US); Steven Mittl, Essex, VT (US); Jian W. Zhu, Flushing, NY (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 10/711,819

(22) Filed: Oct. 7, 2004

(65) Prior Publication Data
US 2006/0077719 A1    Apr. 13, 2006

(51) Int. Cl.
G11C 11/34    (2006.01)
G11C 16/06    (2006.01)

(52) U.S. Cl. ............................ 365/185.28; 365/185.29; 365/207; 365/210

(58) Field of Classification Search ........... 365/185.28, 365/185.29, 185.2, 210, 189.07, 189.09, 365/207
See application file for complete search history.

(56) References Cited

U.S. PATENT DOCUMENTS

| 4,803,662 A | 2/1989 | Tanaka |
| 5,576,990 A * | 11/1996 | Camerlenghi et al. . 365/185.23 |
| 6,518,614 B1 | 2/2003 | Breitwisch et al. |
| 6,535,428 B1 * | 3/2003 | Pasotti et al. .......... 365/185.21 |
| 6,655,758 B1 | 12/2003 | Pasotti et al. |
| 6,816,413 B1 * | 11/2004 | Tanzawa .................. 365/185.2 |
| 6,839,280 B1 * | 1/2005 | Chindalore et al. ...... 365/185.2 |
| 6,937,523 B1 * | 8/2005 | Eshel .................... 365/185.28 |
| 2003/0155599 A1 | 8/2003 | Hsu et al. |

FOREIGN PATENT DOCUMENTS

JP    2001357681 A    12/2001

\* cited by examiner

*Primary Examiner*—Anh Phung
*Assistant Examiner*—Toan Le
(74) *Attorney, Agent, or Firm*—Law Office of Charles W. Peterson, Jr.; Anthony Canale

(57) ABSTRACT

A reprogrammable integrated circuit (IC) including overwritable nonvolatile storage cells. Cell contents are compared in a differential sense amplifier against a variable reference signal that has a number of selectable reference levels corresponding to reprogrammed cell threshold voltages. With each write cycle the nonvolatile storage cells are overwritten and then, compared against a different, e.g., higher, selectable reference level.

20 Claims, 3 Drawing Sheets

REPROGRAMMABLE INTEGRATED CIRCUIT (IC) WITH OVERWRITABLE NONVOLATILE STORAGE

BACKGROUND OF THE INVENTION

1. Field of the Invention

The present invention is related to nonvolatile storage and more particularly to integrated circuit chips including nonvolatile storage such as one or more or an array of nonvolatile random access memory (NVRAM) cells.

2. Background Description

Nonvolatile floating gate storage devices, such as may be used for memory cells in a nonvolatile random access memory (NVRAM), are well known in the industry. In such an NVRAM cell, the cell's conductive state is determined by the charge state of the storage device's floating gate. The floating gate is an electrically isolated gate of a field effect transistor (FET) stacked in a two device NAND-like structure. Charge is forced onto or removed from the floating gate through a thin insulator layer that, normally (during a read operation), isolates the gate electrically from other adjoining conductive layers. For example, a negatively (or positively) charged floating gate is representative of a binary one state, while an uncharged floating gate is representative of a binary zero state or, vice versa.

Typically, the other device in the NAND-like structure is connected to a word line and a bit line. In typical state of the art designs, adjacent cells are connected to a common bit line. The word lines of these adjacent cells must be uniquely addressable and physically distinct. Intersection of each word line with each bit line provides unique cell selection for reading and writing the selected cell. For reading, a read voltage (e.g., $V_{hi}$ or ground) is applied to a control gate (or program gate) that is capacitively coupled to floating gates of the nonvolatile devices of devices being read. Thus, when the word line is raised, those devices programmed for zeros and those programmed for ones do not. For writing, a write voltage is applied to the control gate (or program gate) is capacitively coupled to floating gates of the nonvolatile devices and, when the gate, source and drain voltages are biased properly, the charge changes on the floating gate, i.e., to write selected cells.

Normally, once a state of the art device has been programmed, i.e., charge is forced on the floating gate, the device is first erased before it is re-written. While programming such a state of the art device using channel hot electron techniques may require voltages up to 5V, common erase operations using Fowler-Nordheim tunneling techniques that requires at least twice the write voltage. Thus, these nonvolatile storage devices require special decoder circuits and additional process complexity to handle much higher than normal erase voltages. Additional processing decreases yield. Lower yield increases per chip manufacturing cost. Consequently, the associated yield degradation and additional cost have always been a major inhibitor for embedding reprogrammable nonvolatile storage on other types of chips, e.g., dynamic RAM (DRAM), static RAM (SRAM), microprocessors, custom logic and etc.

Occasionally, logic applications may require some facility to reconfigure in situ or on the fly. Further, this reconfiguration may be infrequent, occurring only a few times over the life of the logic chip. Nonvolatile storage devices have been used for these applications with some success. However, the overhead and cost of including such a nonvolatile facility (e.g., circuit area added for decoders, high voltage drivers and additional processing to handle erase voltages) may outweigh the convenience of including it. This is especially true when scattering the nonvolatile devices across a chip may be most their efficiently use and/or when only a small amount of resident nonvolatile storage (e.g., several hundred, several thousand or even a million devices) is needed/desired. For example, the increase in memory chip cost for including nonvolatile redundancy selection may well outweigh the benefits of electrical programmability and make the memory chip unmarketable.

Thus, there is a need for nonvolatile storage devices that can be written/erased at voltage levels that are on the order of normal read voltages and that do not require special area consuming decode, erase and write circuits.

SUMMARY OF THE INVENTION

It is a purpose of the invention to facilitate inclusion of nonvolatile storage in logic circuits;

It is another purpose of the invention to simplify nonvolatile storage cell use;

It is yet another purpose of the invention to reduce write circuit overhead for nonvolatile storage;

It is yet another purpose of the invention to eliminate erase circuit and voltage overhead on integrated circuit chips that include nonvolatile storage.

The present invention relates to a reprogrammable integrated circuit (IC) including overwritable nonvolatile storage cells. Cell contents are compared in a differential sense amplifier against a variable reference signal that has a number of selectable reference levels corresponding to reprogrammed cell threshold voltages. With each write cycle the nonvolatile storage cells are overwritten and then, compared against a different, e.g., higher, selectable reference level.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
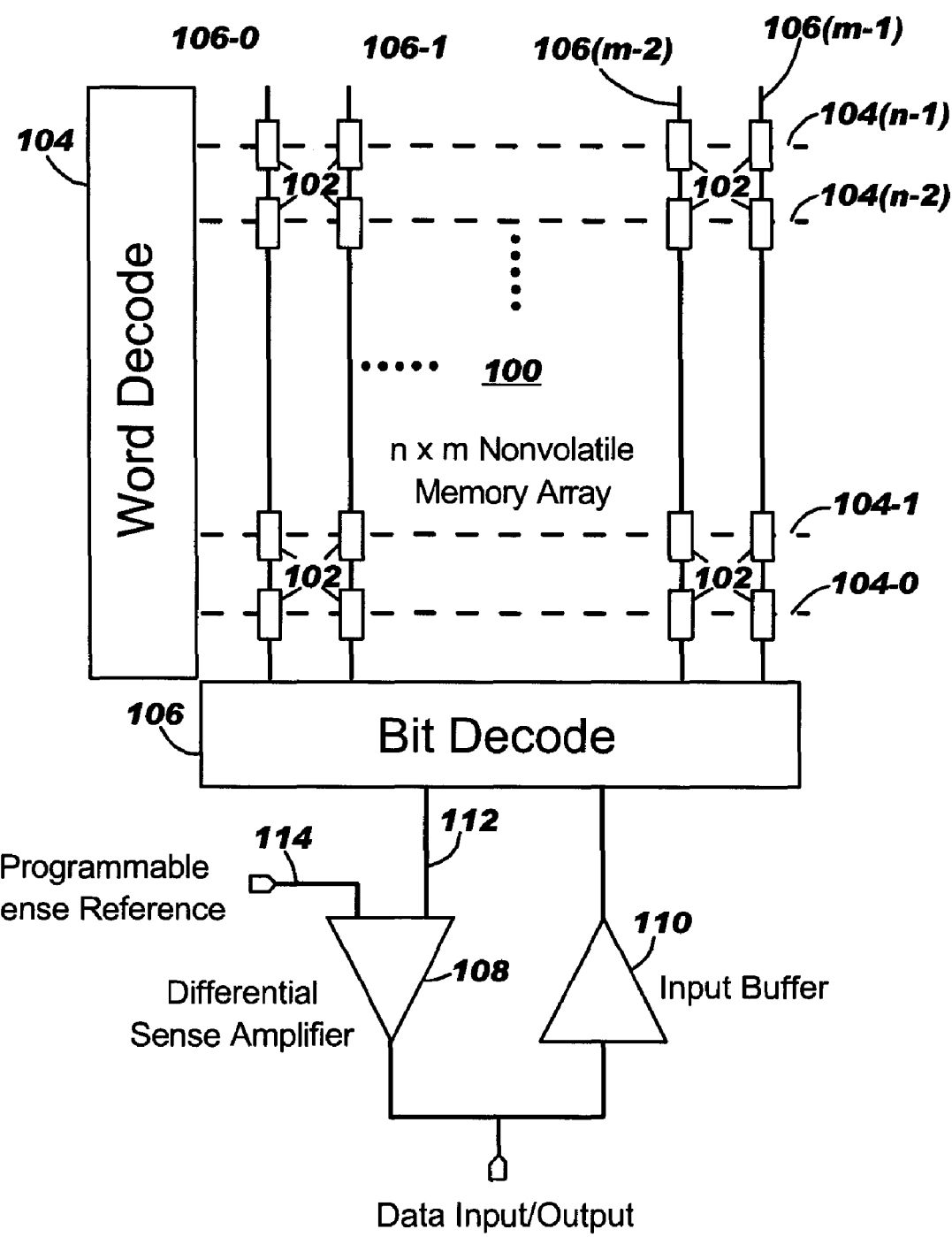
FIG. 1 shows an example of a preferred embodiment nonvolatile storage array wherein cell contents are overwritten in each write cycle, thereby obviating the need for an erase between writes.

Turning now to the drawings and, more particularly, FIG. 1 shows an example of a preferred embodiment nonvolatile storage array 100, wherein cell contents are overwritten in each write cycle, thereby obviating the need for an erase between writes. The nonvolatile storage array 100 may be, for example, an over-writable programmable logic array (PLA) or an over-writable programmable n by m read only memory (PROM) array of nonvolatile storage or nonvolatile random access memory (NVRAM) cells 102. Further, since storage cell contents are being overwritten without an intervening write, small groups of cells 102 or even individual cells may be used in combination with or distributed throughout random logic or logic macros for a rudimentary, electrically alterable engineering change (EC) capability or, for example, in RAM chip select logic.

So, for an NVRAM example, a typical word decode 104 selects one of n word lines 104-0, 104-1, . . . , 104-(n–2) and 104-(n–1), where n is normally a multiple of 2. Similarly, a typical bit decode 106 selects one of m columns 106-0,106-1, . . . , 106-(m–2) and 106-(m–1), where m also is typically a multiple of 2. Although shown in this example and described herein as selecting a single bit line, this is for example only. Columns selected by bit decode 104 may include any suitable number of bit lines, e.g., two, four, eight or etc. As with typical state of the art arrays, cell selection is coincidence of a selected one of the n word lines 104-0, 104-1, . . . , 104-(n–2) and 104-(n–1), with a selected one of the m bit lines 106-0, 106-1, . . . , 106-(m–2) and 106-(m–1). A preferred embodiment column input/output (I/O) includes a differential sense amplifier 108 and an input buffer 110 selectively coupled the m bit lines 106-0, 106-1, . . . , 106-(m–2) and 106-(m–1) through the bit decode 106. The differential sense amplifier 108 compares a selected bit line signal 112 against a current state reference signal 114. The current state reference signal 114 is an adjustable reference voltage providing a contemporaneous comparison point for determining between a first logic state and second logic state on the selected bit line signal 112.

Figure 2:
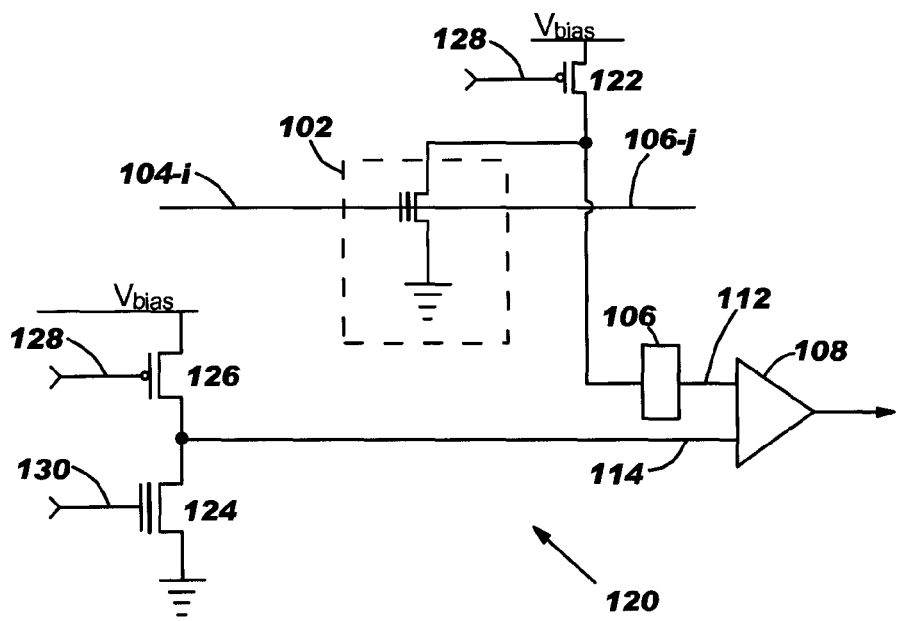
FIG. 2 shows a cross sectional example of an overwritable nonvolatile cell, e.g., as one of one or more stand alone cells or as a typical cell in an array.

FIG. 2 shows an example of a preferred embodiment cross section 120, which may include one or more cell 102 as a stand alone cell or as a typical cell 102 in an array, e.g., connected to word line 104-i and bit line 106-j of the nonvolatile storage array 100 of FIG. 1 with like elements labeled identically. A bit read bias FET 122 is connected between an array bias voltage ($V_{bias}$) and each bit line 106-0, 106-1, . . . , 106-(m–2) and 106-(m–1). Each bit read bias FET 122 loads accessed cells 102 connected to corresponding bit lines 106-0, 106-1, . . . , 106-(m–2) and 106-(m–1). A dummy cell 124 and bias FET 126 develop the current state reference signal 114 input to differential sense amplifier 108. The gates of the bit read bias FETs 122 and bias FET 126 are driven by the same bias control signal 128. A reference select signal 130 turns the dummy cell on during read accesses.

Upon selecting a word line, each of the n cells on a selected word line 104-i develop a signal on the connected bit line 106-0, 106-1, . . . , 106-(m–2) and 106-(m–1). The magnitude of the signal and the rate of change at which the signal develops on each bit line 106-0, 106-1, . . . , 106-(m–2) and 106-(m–1) depends upon each corresponding cell's characteristics and whether the corresponding cell is programmed (e.g., a logic zero (0)) with a higher charge deposited on the floating gate or unprogrammed (a logic one (1)) no charge or a remnant lesser charge. So for this example, an unprogrammed cell develops a larger signal than a programmed cell. Bit decode 106 couples a selected bit line 106-j to differential sense amplifier 108. Simultaneously with driving the word line 104-i, the bit read bias FETs 122, the dummy cell 124 and the bias FET 126 are turned on. So, as the signal develops on the bit lines 106-0, 106-1, . . . , 106-(m–2) and 106-(m–1), the dummy cell 126 develops a reference signal on the current state reference signal 114 at one input to differential sense amplifier 108. Preferably, the reference signal is midway between the signal developed by unprogrammed cells and programmed cells. The signal on the selected bit line 106-j is passed to the other input 112 to differential sense amplifier 108. Once sufficient signal develops to sense cell contents, the differential sense amplifier 108 compares the bit line signal 112 against a current state reference signal 114.

So, if the threshold voltage for the selected cell 102 is below that of the dummy cell 124 (i.e., the selected cell 102 is unprogrammed in this example); the selected cell 102 develops a larger signal on the bit line 106-j, which develops more quickly than the current state reference signal 114 from the dummy cell 124. The signal on the bit line 106-j is provided to differential sense amplifier input 112; and the differential sense amplifier 108 responds by driving the output to the appropriate logic state, e.g., a logic one. By contrast, if the threshold voltage for the selected cell 102 is above that of the dummy cell 124, a smaller signal than the reference signal develops on the bit line 106-j and is provided to input 112 to differential sense amplifier 108; the differential sense amplifier 108 responds by driving the output to the other, opposite logic state, a logic zero.

It should be noted that the signal may be measured transiently (e.g., loading the dummy cell with capacitance equivalent to that of the bit lines and comparing developing signals), statically (e.g., maintaining a device ratio between the cells/dummy cells and the bias FETs and comparing the steady state final voltages) or some combination thereof. In each write cycle, programmed cell thresholds are shifted up with the new lower threshold shifted above or to the previously higher threshold and the dummy cell threshold is shifted to some point, preferably, midway between the higher and lower of the two new cell thresholds or to provide a signal response midway between the programmed and unprogrammed signal responses. Preferably also, the lower threshold for each subsequent write is at the upper level for the immediately preceding write cycle. Thus, instead of erasing before writing, new data is merely programmed over previously written data with ones in this example being unprogrammed for the current write cycle and only zeros being programmed by having thresholds raised above the dummy cell threshold. Thus, higher voltage erase circuits are unnecessary as are precautions usually needed to channel higher erase voltages to array cells. Accordingly, the current state reference signal 114 is write cycle dependent and representative of a voltage threshold or data transition point for differentiating between a logic one and a logic zero for the most recent write cycle.

Figure 3:
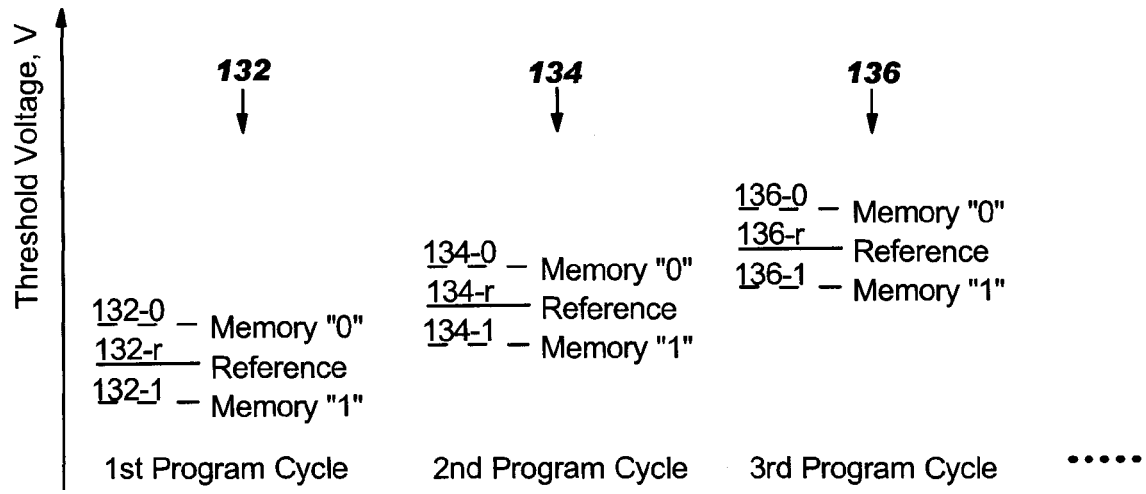
FIG. 3 shows an example of the device threshold shifts for programmed, unprogrammed and reference cells over three write cycles.

FIG. 3 shows the device thresholds shifting for programmed, unprogrammed and reference cells over three write cycles 132, 134 and 136, in this example, with reference to the array of FIG. 1 and the cross section of FIG. 2. It should be noted that represented voltage levels are not to scale or representative of any specific cycle to cycle relationship. Further, although shown as being programmed with three write cycles in this example, this is for example only. Preferred embodiment chips may be programmed as may times as the particular chip or technology may support or as few times as is necessary for the particular application.

However, in each write cycle 132, 134, 136 of this example, the zero threshold is designated –0, the one threshold is designated –1 and the reference threshold is designated –r. Cells are written as with any typical state of the art NVRAM cell by selecting cells identified as zeros; pulsing the selected cells with write voltages; checking the contents of the pulsed cells; and repeating until valid zeros are sensed at the selected cells. Initially, all cells have an intrinsic or unprogrammed threshold 132-1. So, in the first write cycle 132 zeros are written in cells with the thresholds of those programmed cells 102 being increased or shifted up, e.g., from the unprogrammed threshold 132-1 to a higher programmed threshold 132-0. In the second write cycle 134, the reference threshold 134-r is adjusted upward. The reference level may be verified before programming, e.g., by checking for an indication of an empty/apparently unprogrammed array with thresholds at the unprogrammed level 134-1, i.e., below the reference threshold 134-r. The previously unprogrammed cells may also be shifted up to new one level 134-1 or, preferably, simply be left at their current thresholds, provided the reference level 134-r is at least as high as the previous write cycle zero threshold 132-0. After the reference threshold 134-r is set, selected cells are programmed for zeros, i.e., the threshold is shifted up to 134-0. Similarly, in the third write cycle 136, the reference level 136-r is adjusted upward, selected cells are programmed for zeros, i.e., the threshold is shifted up to 136-0, and optionally, the ones may also be shifted up to new one level 136-1.

Figure 4:
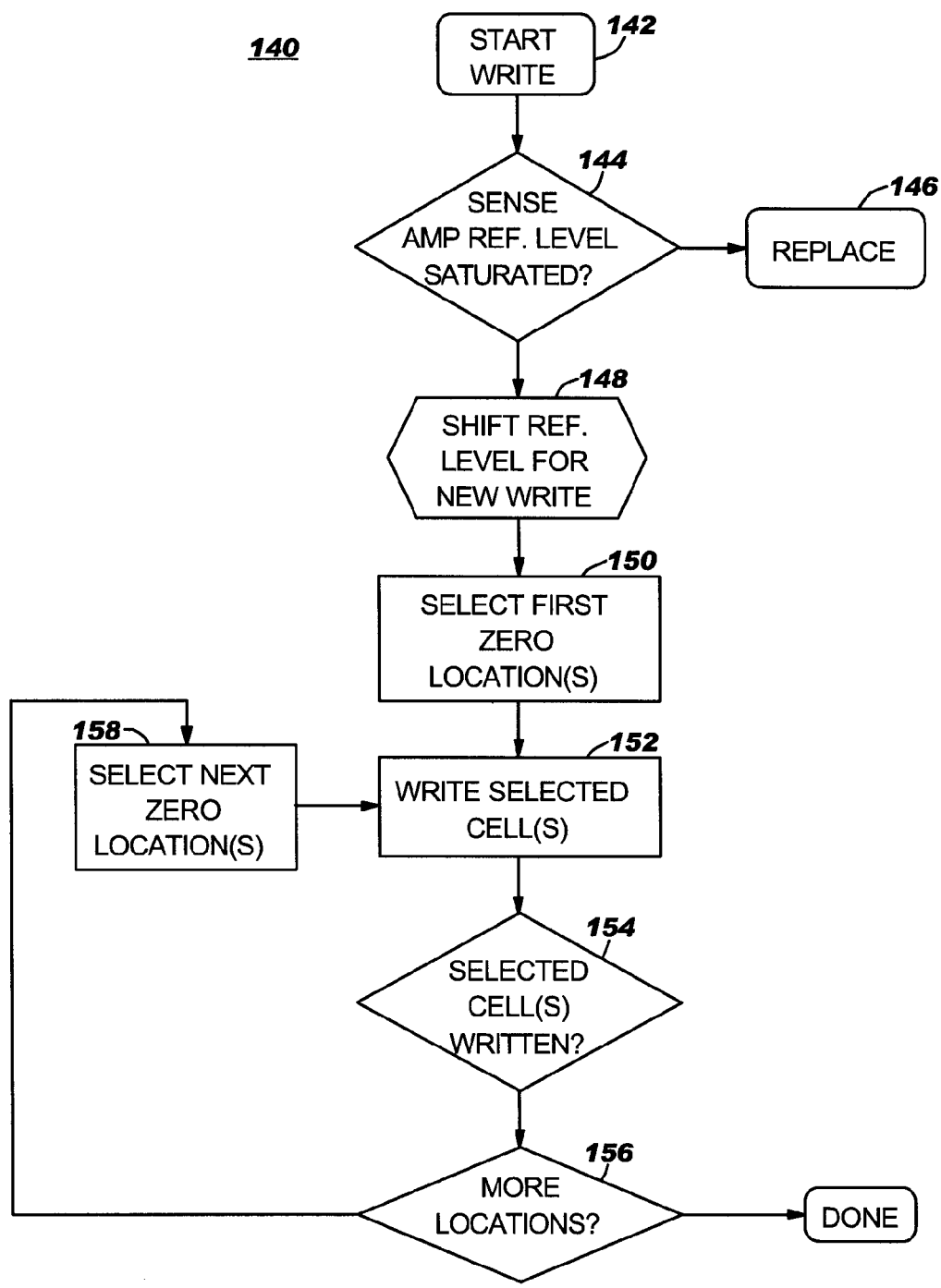
FIG. 4 is an example of a flow diagram showing steps in programming preferred embodiment storage cells.

FIG. 4 is a flow diagram 140 showing steps in programming preferred embodiment storage cells, e.g., cells 102 in an array 100 of FIG. 1 or individual cells 102 such as are shown in the cross section of FIG. 2. When a write cycle starts in step 142, the current state reference signal 114 is checked in step 144 at the differential sense amplifier 108 to determine if any programming margin remains. If not, in step 146 the chip/array 100/circuit 120 being modified/overwritten is at end of life and must be replaced. Otherwise, if programming margin remains, then continuing to step 148, the reference level is shifted, e.g., by programming the dummy cell 124. The reference level check step 144 and shift step 148 may be done simply by programming the dummy cell 124 and checking the programmed dummy cell 124 against a known previously programmed location for a opposite response by the differential sense amplifier 108, i.e., that the previously programmed location indicates that it is unprogrammed. Once the reference level has been shifted in step 148, essentially, all of the cells have been unprogrammed; not erased but, unprogrammed. Next, in step 150 the first location identified for programming is selected for overwriting. Programming begins in step 152, e.g., pulsing the selected cell(s) with a write voltage. In step 154 the contents of the selected cell(s) are checked to determine if the selected cell(s) has(have) been programmed. If not, returning to step 152, writing to the selected location continues. Optionally, the saturation determination step 144 may be done or repeated at this step 154, e.g., if the selected cells have not been programmed after a selected number of write iterations. Once the selected cells are determined to have been written in step 154, if more cells remain to be programmed in step 156, a next location is selected in step 158 and written in step 152. This continues until all of the cells have been selected in step 158 and written in step 152, i.e., no cells remain in step 156. Optionally, cell contents checking step 154 and location checking steps 156 may be swapped, doing a write pass through all of the locations in step 156 before checking in step 154 and following with another pass, if necessary.

Advantageously, preferred embodiment overwritable nonvolatile storage may be used in any suitable volume or configuration, whether as individual storage devices distributed in chip logic for ECs or for re-programmable chip selects or, grouped in an array e.g., for ECable BIOS or in an overwritable PLA. Additionally, since cell contents are overwritten with each write cycle, e.g., taking the previous zero threshold as the new one threshold voltage, erase logic and circuits are unnecessary and so, the manufacturing process is much simpler for preferred embodiment chips.

While the invention has been described in terms of preferred embodiments, those skilled in the art will recognize that the invention can be practiced with modification within the spirit and scope of the appended claims.

What is claimed is:

1. A method of programming nonvolatile memory (NVM) cells comprising:
    a) providing a plurality of NVM cells;
    b) providing a variable reference signal, said variable reference signal being varied to one of a plurality of reference levels corresponding to reprogrammed threshold voltages;
    c) selecting a state threshold from said plurality of reference levels, the selected said state threshold establishing a logic level threshold;
    d) programming ones of said plurality of NVM cells responsive to said state threshold; and
    e) returning to step (b) without erasing previously programmed said ones.

2. A method of programming NVM cells as in claim 1, wherein the step (c) of selecting a state threshold comprises programming a dummy NVM cell to a reference threshold level, said reference threshold level being at least at a current programmed cell threshold, said current programmed cell threshold being higher than a current unprogrammed cell threshold.

3. A method of programming NVM cells as in claim 1, wherein the step (d) of programming NVM cells comprises:
    i) selecting ones of said plurality of NVM cells; and
    ii) increasing the cell threshold for selected said ones to a higher cell threshold.

4. A method of programming NVM cells as in claim 3, wherein the step (d) of programming NVM cells further comprises:
    iii) comparing said selected ones of said plurality of NVM cells against said variable reference signal for an indication that said ones have been programmed; and
    iv) returning to step (i) for any of said selected ones not providing said indication.

5. A method of programming NVM cells as in claim 4, wherein said NVM cells are included on an integrated circuit (IC) chip and once an upper one of said plurality of reference levels has been provided, an indication is provided that said IC chip should be replaced.

6. A method of programming NVM cells as in claim 5, wherein said NVM cells are in logic on said IC chip, whereby said NVM cells are not erased between writes.

7. A method of programming NVM cells as in claim 5, wherein said NVM cells are in an array of previously programmed said NVM cells on said IC chip, whereby said array is not erased between writes.

8. A reprogrammable integrated circuit (IC) comprising:
    a plurality of nonvolatile storage cells;
    a differential sense amplifier, ones of said plurality of nonvolatile storage cells being selectively coupled to a first input of said differential sense amplifier;
    a variable reference signal coupled to a second input of said differential sense amplifier, said variable reference signal having a plurality of selectable reference levels corresponding to reprogrammed cell threshold voltages, wherein with each write cycle a different one of said selectable reference levels is coupled to said second input, contents of said nonvolatile storage cells subsequently being compared by said differential sense amplifier against said different one; and
    a dummy cell loaded by an active dummy load device and developing said variable reference.

9. A reprogrammable IC as in claim 8, wherein said dummy cell has a threshold voltage programmed with each said write cycle at least at a current cell threshold voltage and below a reprogrammed cell threshold voltage.

10. A reprogrammable IC as in claim 9, wherein at least one of said plurality of nonvolatile storage cells is embedded in logic on said IC.

11. A reprogrammable IC as in claim 9, wherein said IC is a CMOS IC, said nonvolatile storage cells and said dummy cell are n-type field effect transistor (NFET) floating gate devices and said dummy load device is a p-type field effect transistor (PFET), said reprogrammable CMOS IC further comprising:
 a load PFET loading ones of said plurality of nonvolatile storage cells coupled to said first input of said differential sense amplifier.

12. A reprogrammable CMOS IC as in claim 11, further comprising an array of said nonvolatile storage cells.

13. A reprogrammable CMOS IC as in claim 12, wherein said array is a nonvolatile memory array, said IC further comprising:
 a word decode partially selecting ones of said plurality of nonvolatile storage cells connected to one of a plurality of word lines; and
 a bit decode selectively coupling partially selected said ones to said first input of said differential sense amplifier.

14. A reprogrammable IC as in claim 8, wherein at least one of said plurality of nonvolatile storage cells have a programmed cell threshold voltage and remaining ones of said storage cells have an unprogrammed cell threshold voltage below said programmed cell threshold voltage.

15. A reprogrammable IC as in claim 9, wherein said remaining ones of said storage cells have one a of a plurality of unprogrammed cell threshold voltages below said programmed cell threshold voltage.

16. A reprogrammable CMOS integrated circuit (IC) comprising:
 a plurality of nonvolatile storage cells;
 a differential sense amplifier, nonvolatile storage cells being coupled to a first input of said differential sense amplifier;
 a variable reference signal coupled to a second input of said differential sense amplifier, said variable reference signal having a plurality of selectable reference levels corresponding to reprogrammed cell threshold voltages, wherein with each write cycle a different one of said selectable reference levels is coupled to said second input, contents of said nonvolatile storage cells subsequently being compared by said differential sense amplifier against said different ones;
 a dummy cell developing said variable reference, said dummy cell having a threshold voltage programmed with each said write cycle at least at a current cell threshold voltage and below a reprogrammed cell threshold voltage; and
 an active dummy load device loading said dummy cell.

17. A reprogrammable CMOS IC as in claim 16, further comprising:
 an nonvolatile memory array of said nonvolatile storage cells;
 a word decode partially selecting ones of said plurality of nonvolatile storage cells connected to one of a plurality of word lines; and
 a bit decode selectively coupling partially selected said ones to said first input of said differential sense amplifier.

18. A reprogrammable CMOS IC as in claim 17, further comprising:
 an active load device loading ones of said plurality of nonvolatile storage cells coupled to said first input of said differential sense amplifier.

19. A reprogrammable CMOS IC as in claim 16, wherein at least one of said plurality of nonvolatile storage cells is embedded in logic on said IC.

20. A reprogrammable CMOS IC as in claim 16, wherein at least one of said plurality of nonvolatile storage cells have a programmed cell threshold voltage and remaining ones of said storage cells have a plurality of unprogrammed cell threshold voltages below said programmed cell threshold voltage.

* * * * *